United States Patent [19]

Delacourt et al.

[11] Patent Number: 5,615,042

[45] Date of Patent: Mar. 25, 1997

[54] COMPACT OPTICAL SOURCE BASED ON THE FREQUENCY DOUBLING OF A LASER AND SELF-STABILIZED BY THE DEPLETION OF THE PUMP

[75] Inventors: Dominique Delacourt, Clamart; Michel Papuchon, Villebon Palaiseau; Eric Lallier, Levallois - Perret; Thierry Debuisschert, Orsay, all of France

[73] Assignee: Thomson-CSF, Paris, France

[21] Appl. No.: 529,175

[22] Filed: Sep. 15, 1995

[30] Foreign Application Priority Data

Sep. 23, 1994 [FR] France .................................. 94 11376

[51] Int. Cl.⁶ .................................................. G02F 1/35
[52] U.S. Cl. ......................... 359/338; 359/326; 359/328; 372/22
[58] Field of Search .................................. 359/326, 328, 359/338; 372/22

[56] References Cited

U.S. PATENT DOCUMENTS

| | | |
|---|---|---|
| 5,060,233 | 10/1991 | Harder et al. ............................ 372/22 |
| 5,077,466 | 12/1991 | Delacourt et al. . |
| 5,077,750 | 12/1991 | Pocholle et al. . |
| 5,086,433 | 2/1992 | Pocholle et al. . |
| 5,088,096 | 2/1992 | Pocholle et al. . |
| 5,105,428 | 4/1992 | Pocholle et al. . |
| 5,123,025 | 6/1992 | Papuchon et al. . |
| 5,128,948 | 7/1992 | Papuchon et al. . |
| 5,138,628 | 8/1992 | Pocholle et al. . |
| 5,202,891 | 4/1993 | Sleight et al. ............................ 372/21 |
| 5,222,093 | 6/1993 | Pocholle et al. . |
| 5,231,643 | 7/1993 | Naya et al. ............................ 372/94 |
| 5,243,617 | 9/1993 | Pocholle et al. . |
| 5,247,168 | 9/1993 | Pocholle et al. . |
| 5,289,309 | 2/1994 | Delacourt et al. . |
| 5,301,059 | 4/1994 | Kitaoka et al. ......................... 359/332 |
| 5,311,540 | 5/1994 | Pocholle et al. . |
| 5,369,524 | 11/1994 | Pocholle et al. . |
| 5,375,131 | 12/1994 | Pocholle et al. . |

FOREIGN PATENT DOCUMENTS

| | | |
|---|---|---|
| 0473441 | 3/1992 | European Pat. Off. . |
| 0576197 | 12/1993 | European Pat. Off. . |

OTHER PUBLICATIONS

F. Laurell, Stable Blue Second–Harmonic Generation in a KTP Waveguide with a Diode Laser in an External Cavity; Electronics Letters, vol. 29, No. 18, Sep. 2, 1993, pp. 1629–1630.

W.P. Risk et al., Generation of 425–nm Light by Waveguide Frequency Doubling of a GaAlAs Laser Diode in an Extended–Cavity Configuration; Applied Physics Letters, vol. 63, No. 23, Dec. 6, 1993 New York, US, pp. 3134–3136.

*Primary Examiner*—Mark Hellner
*Attorney, Agent, or Firm*—Oblon, Spivak, McClelland, Maier & Neustadt, P.C.

[57] ABSTRACT

Disclosed is a compact optical source capable of emitting wavelengths (notably in the blue spectrum) which it is difficult for standard laser diodes to achieve. This source has a laser (or laser diode) emitting at a wavelength $\lambda oi$, a non-linear medium (NLM) in which the phase matching condition is achieved at a wavelength $\lambda o_a$ belonging to the set of $\lambda o_i$ values, a mirror $M_l$ transparent at $\lambda o_l/2$ and reflective at $\lambda oi$ placed at output of the medium (NLM) By reinjecting wavelengths $\lambda oi \neq \lambda oa$ into the laser, it is possible to lock the emission of the laser to $\lambda oa$ and thus set up a high-powered optical source $\lambda o_a/2$. Application: blue sources.

17 Claims, 3 Drawing Sheets

COMPACT OPTICAL SOURCE BASED ON THE FREQUENCY DOUBLING OF A LASER AND SELF-STABILIZED BY THE DEPLETION OF THE PUMP

BACKGROUND OF THE INVENTION

1. Field of the Invention

The field of the invention is that of compact optical sources capable of emitting in the spectral domains, in which emission is not possible for lack of appropriate laser materials or the difficulty of obtaining them, these sources carrying out their emission by operations of frequency conversion.

Indeed, by using the second-order non-linear susceptibility of certain materials such as lithium niobate ($LiNbO_3$), it is possible, with an illumination in the near infrared, to emit in the blue region of the spectrum through the phenomenon of frequency doubling.

In the frequency doubling operation, in order that the optical power transfer done on the basis of the incident illumination at the wavelength $\lambda$ may be efficient, it is necessary, in the material and throughout the interaction, for the non-linear polarization induced by the incident wave to have its phase matched with the wave created at the wavelength ½ which it is sought to feed. However, in general, and because of the dispersal of the refraction indices of the material at $\lambda\omega$ and $\lambda\omega/2$, this phase-matching condition is not met straight away.

2. Description of the Prior Art

To circumvent this obstacle, a first approach consists in taking advantage of the birefringence of certain materials in order to compensate for the range of variation of their index. There also exists an alternative approach that consists of the use of quasi-phase matching (QPM) applicable in conditions that are far more general than those relating to the birefringence of certain materials. This alternative approach consists in periodically disturbing the nonlinear interaction in order to compensate for the wave vector difference responsible for the phase mismatching.

More precisely, let us take an incident wave being propagated along the axis Ox in the non-linear material and having electrical fields:

$$E\omega = E_{\omega,o}\, e^{j(\omega t - \beta_\omega x + \phi P_o)}$$

with a wavelength $\lambda\omega = 2\pi c/\omega$, $\phi p_o$ the phase shift of the pump wave with $b\omega$ being the constant of propagation of the pump wave and $\beta_\omega = 2\pi n_\omega/\lambda\omega$ c: the velocity of light in vacuum $\omega$: frequency.

In an appropriate material, this wave may give rise to a second-order non-linear polarization written as follows:

$$P_{NL} = \epsilon_o d E_\omega^2 = \epsilon_o d E_{\omega,o}^2 e^{j(2\omega t - 2\beta_\omega x + 2\phi_{po})}$$

with $\phi_{po}$ as the phase shift of the pump wave, before reflection on the mirror.

where d is the non-linear coefficient brought into play and
$\epsilon_o$ is the dielectric permittivity of the vacuum.

This polarization radiates a wave at double frequency liable, as and when the interaction takes place, to set up a harmonic beam with a half wavelength $\lambda 2\omega = \lambda\omega/2$ and a propagation constant $b2\omega$ with $b_{2\omega} = 2\pi n_{2\omega}/\lambda 2\omega$ where $n_{2\omega}$ is the refraction index of the material at the wavelength $\lambda 2\omega$. The electrical field corresponding to this wave may be written as follows:

$$E_{2\omega} = E_{2\omega,o}\, e^{j(2\omega t - \beta_{2\omega} x + \phi_{ho})}$$

with $\phi_{ho}$ as the phase shift of the pump wave, before reflection on the mirror.

It can thus be seen that the phase shift $\Delta\phi$ between the non-linear polarization that forms the source of the radiation at $\lambda 2\omega$ and the harmonic wave that is to be fed constructively by means of this polarization will play a decisive role in the conversion $\lambda\omega \rightarrow \lambda 2\omega$. In fact, this phase shift is expressed at the end of a distance x of interaction as follows:

$$\Delta\phi = (\beta_{2\omega} - 2\beta_\omega)x = \Delta\beta x$$

with $$\Delta\beta = 4\pi(n_{2\omega} - n\omega)/\lambda\omega = 4\pi\Delta n/\lambda\omega$$

It can clearly be seen that, because of the range of variation of the indices, this phase shift is generally not zero.

However, it is possible to create a periodic variation $\Delta\beta = m.K$ or $K = 2\pi/\Lambda$ with $\Lambda$ as the period of the disturbance and $\Lambda = 2L_C$ if $L_C$ is the length of coherence corresponding to the interaction distance at the end of which the polarization and harmonic wave have accumulated a $\pi$ phase shift.

The disturbance may be introduced into any parameter coming into play in the non-linear interaction (refraction index, dispersion of the indices, non-linear coefficient brought into play, etc.).

Through this periodic disturbance, the phase shift Deltaf between polarization and harmonic wave is reduced by $\pi$ at the end of each $L_C$, namely instead of continuing to accumulate, it is reduced to zero at each coherence length. In this respect, FIG. 1 illustrates the three possible examples: curve a) phase mismatching, curve b): quasi-phase matching, curve c): perfect phase matching.

The object of the invention relates to a source using a laser emitting an instant wave at $\lambda\omega$ so as to generate a wave $\lambda 2\omega$ by means of a frequency doubler, the frequency doubler being a non-linear medium (NLM) in which the phase matching condition or the quasi-phase matching condition is achieved at the wavelength $\lambda\omega$.

The source according to the invention enables the problem of the spectral width of emission of the laser to be resolved. This phenomenon is pronounced in the laser diode context whereas the phase matching conditions or quasi-phase matching conditions are met in the medium (NLM) only for certain very precise wavelengths.

For this purpose, the compact source according to the invention uses the "locking" of the emission length of the laser by the injection, into this wave, of a signal with given wavelengths.

The invention is based on the following observation which has been arrived at empirically:

When a laser diode is used to pump a waveguide laser of the Nd:MgO:LiNbO$_3$ type described in the reference (E. Lallier, J. P. Pocholle, M. Papuchon, M. de Micheli, M. J. Li, Q. He, D. B. Ostrowsky, C. Grezes-Besset and E. Pelletier, "Nd:MgO:LiNbO$_3$ channel waveguide laser devices", IEEE J. Quantum Electron. 27 (3), pp. 618–625, 1991), the laser diode locks its transmission wavelength automatically to the value corresponding to the maximum absorption of neodymium in LiNbO$_3$.

This means that it is possible to lock the emission wavelength of a laser emitting an incident wave in a range of wavelengths $\lambda o_i$ to the wavelength $\lambda o_a$ by the reinjection, into said laser, of a light wave whose energy level at the wavelength $\lambda o_a$ is highly depleted as compared with the energy levels of the wavelength $\lambda o_i \neq \lambda o_a$.

Thus, the invention makes use of this phenomenon to lock the emission of the laser used to supply the frequency doubling medium (NLM) at the wavelength $\lambda o_a$ for which the phase matching condition or quasi-phase matching condition is met within said medium (NLM).

Indeed, in the frequency doubling operation, the harmonic power generated is directly taken from the power of the pump wave and, when the conversion efficiency becomes considerable, the depletion of the pump wave itself becomes appreciable, in this case at the wavelength $\lambda o_a$.

SUMMARY OF THE INVENTION

This is why an object of the invention specifically is a compact optical source, comprising a laser emitting an incident wave in a range of wavelengths $\lambda$ oi and a non-linear medium (NLM), wherein:

the phase matching condition enabling the cancellation of or compensation for the difference in propagation constant between firstly the non-linear polarization created by the incident wave and, secondly, the harmonic wave generated by this polarization is achieved at the wavelength $\lambda o_a$ belonging to the set of $\lambda o_i$ values, in the medium (NLM);

the optical source also includes a dichroic mirror $M_1$ placed in such a way that the medium (NLM) is contained between the laser and the mirror, said mirror being highly reflective at the wavelength $\lambda oi$ and highly transparent at the wavelength $\lambda o_a/2$ in such a way as to reinject a light wave at $\lambda o_a$ into the laser, the energy level of which at the wavelength $\lambda oa$ is highly depleted with respect to the energy levels at the wavelengths $\lambda oi \neq \lambda oa$.

In the compact optical source according to the invention, the laser may advantageously be a laser diode.

The phase matching condition may be ensured by the birefringence of the medium (NLM) in certain ranges of wavelength, with certain $LiNbO_3$ type non-linear media.

For emission wavelengths not compatible with standard birefringent non-linear materials, the quasi-phase matching condition may be ensured by a periodic variation of a physical parameter of the medium (NLM) playing a role in the non-linear interaction between the non-linear polarization created and the harmonic wave.

The mirror $M_1$ may advantageously be integrated into the non-linear medium (NLM), and notably in the case of a waveguide, it may be facing the output of this guide.

The medium (NLM) may advantageously be a lithium tantalate ($LiTaO_3$) or lithium niobate ($LiNbO_3$) or potassium and titanyl phosphate (KTP) type of medium.

BRIEF DESCRIPTION OF THE DRAWINGS

The invention will be understood more clearly and other advantages shall appear from the following description and from the appended figures, of which.

Figure 1:
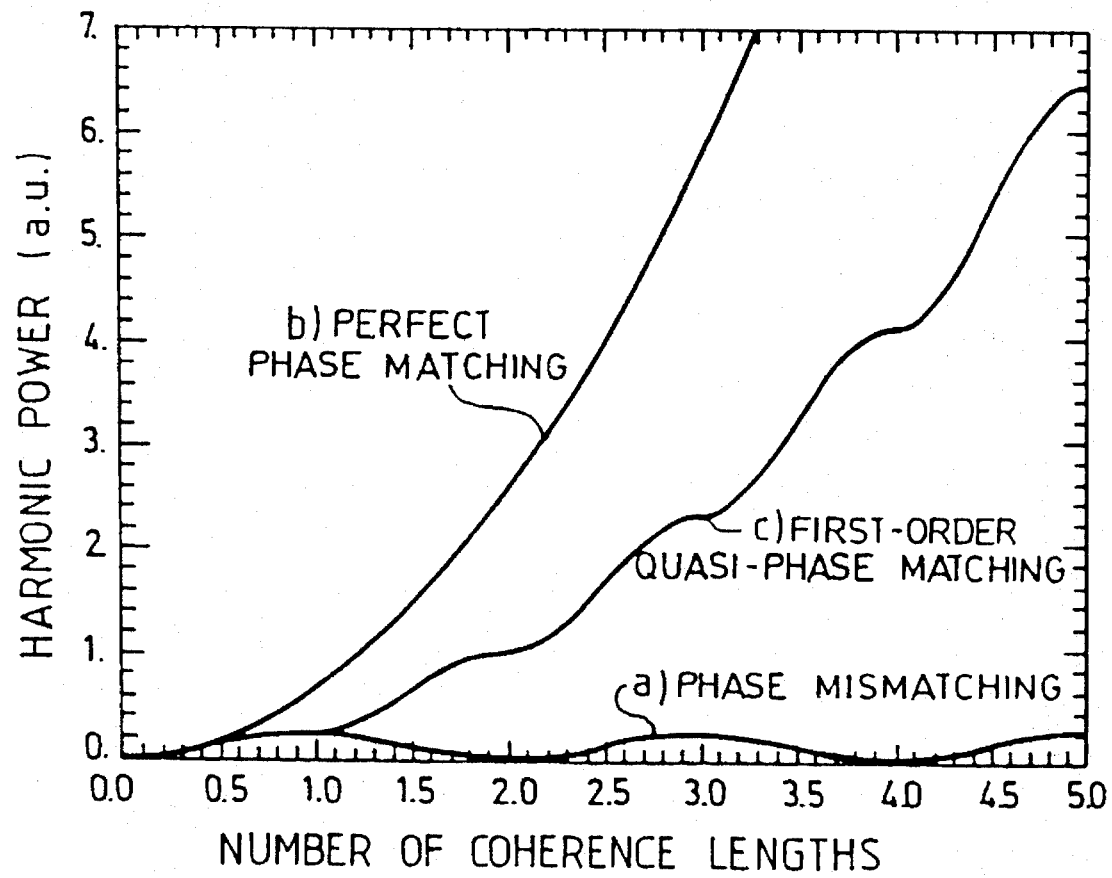
FIG. 1 shows the progress of the harmonic power as a function of the interaction distance in the following cases.
Figure 2:
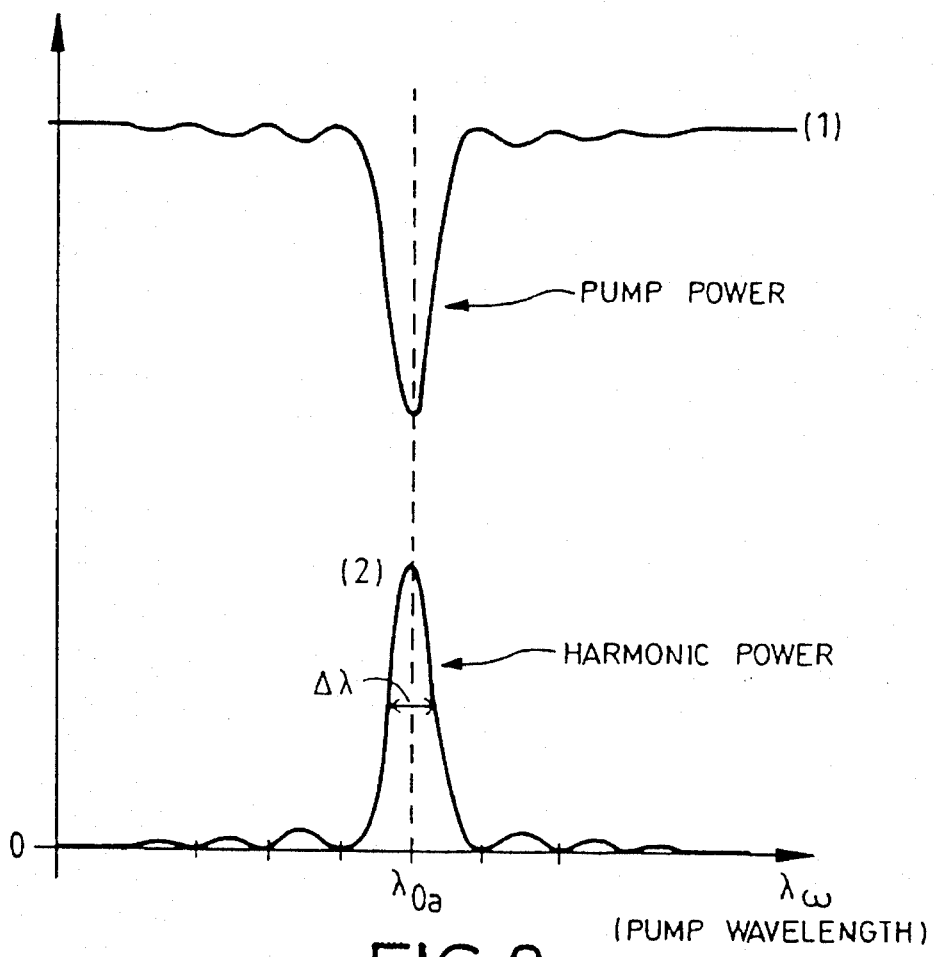
Figure 3:
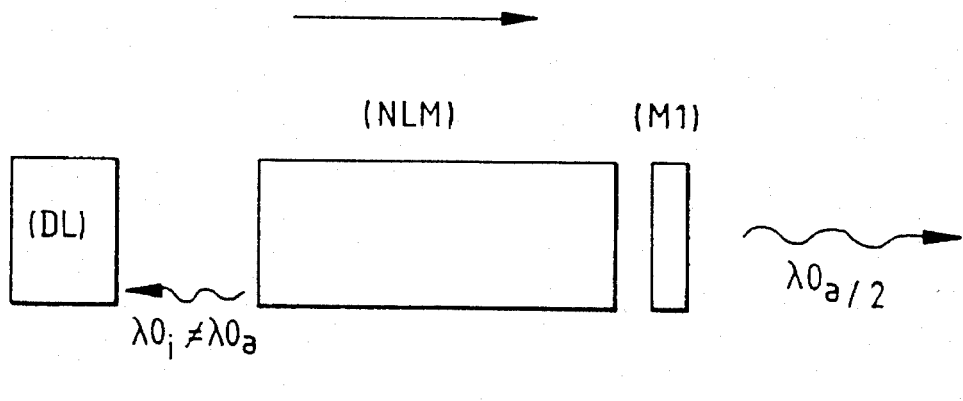
Figure 4:
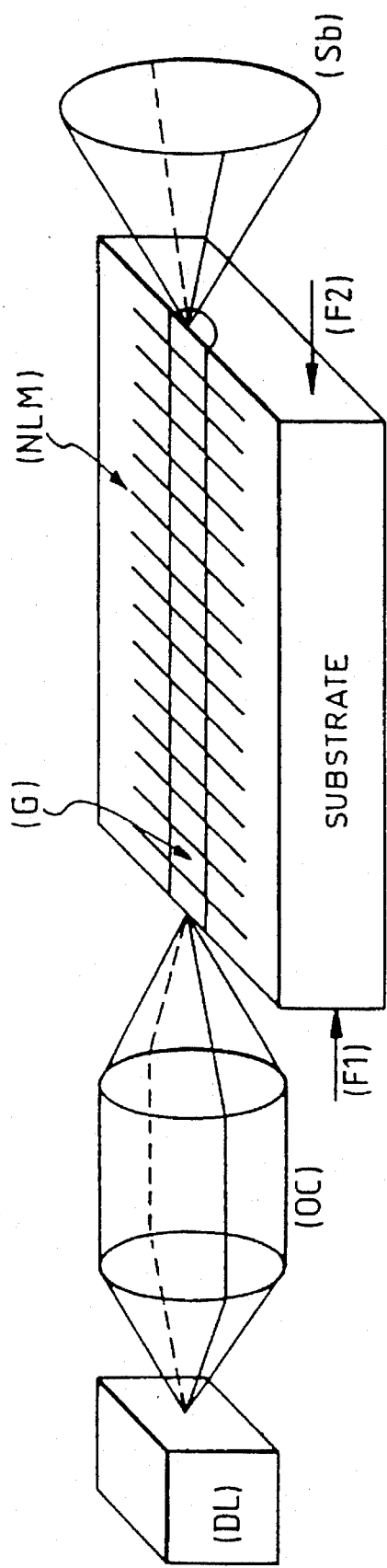

a) phase mismatching b) perfect phase matching c) quasi-phase matching;

FIG. 2 illustrates the development of the power as a function of the pump wavelength for the pump wave (curve 1) and the harmonic wave (curve 2);

FIG. 3 gives a schematic view of the principle of the invention in a possible exemplary configuration;

FIG. 4 illustrates an exemplary optical source according to the invention made in guided optics.

MORE DETAILED DESCRIPTION

In order to make a compact coherent optical source with particularly sought-after wavelengths (notably blue sources), the invention proposes the use of a laser capable of the optical pumping of a non-linear medium (NLM) within which there is created, by frequency doubling, a wave at a frequency which is twice that of the pump wave. To obtain sufficient power at the doubled frequency, it is advantageous to block the emission of the laser at the wavelength for which the phase matching condition is ensured in the non-linear medium (NLM). FIG. 2 gives a view, as a function of the pump wavelength $\lambda\omega$, of the changes associated with the harmonic power (curve 2) and that of the pump wave (curve 1), if the phase matching condition is achieved at $\lambda o_a$ with a spectral acceptance of $\Delta\lambda$.

These curves show that the pump wave undergoes a depletion that is spectrally highly selective in terms of wavelengths related to the frequency doubling.

The locking of the laser to the emission wavelength preferably at $\lambda o_a$ may occur by the reinjection, into said laser, of an optical signal devoid of the fine spectral range corresponding to the phase matching condition.

One of the possible configurations to implement the invention is shown in FIG. 3.

A laser, especially a laser diode (DL), emits a beam with a wavelength $\lambda\omega$. This beam is partly frequency doubled and generates a harmonic wave when the emission wavelength of the diode is close to $\lambda o_a$ or equal to it. At the output of the doubler (nonlinear medium), a dichroic mirror ($M_1$) enables the pump power to be sent back to a high degree, through the medium (NLM), into the laser diode, letting through the optical wave created at the wavelength $\lambda o_a/2$ which may be thus used as an optical wave at a frequency that is difficult to obtain (notably blue source). It must be noted that the greater the extent to which the emission of the laser is centered on the wavelength $\lambda o_a$ for which the phase matching condition is met, the greater is the optical power collected at the wavelength $\lambda o_a/2$.

In the case of a non-linear medium (NLM) in which the phase matching condition is real, the output mirror ($M_1$) must fulfill certain conditions at the phase shifts that it creates for the harmonic wave at $\lambda o_a/2$ and the wave at $\lambda o_a$. Indeed, in the OUTGOING direction shown in FIG. 3 by means of the arrow ($\rightarrow$), the conversion between the pump wave ($\lambda o_a$) and the harmonic wave ($\lambda o_a/2$) leading to the frequency doubling operation is such that $2\phi_{po} - \phi_{ho} = -\pi/2$ (1). To preserve this frequency doubling operation in this so-called RETURN direction shown in FIG. 3 by means of the arrow ($\leftarrow$), it is necessary for the mirror ($M_1$) not to introduce any phase shifts $\phi_p$ and $\phi_h$ respectively on the pump wave and the harmonic wave such that they meet the relationship $2\phi_p - \phi_h = \pi$ (2). Indeed, in such a case, the phase relationship between $\phi_{po}$ and $\phi_{ho}$ becomes the relationship $2\phi_{po} - \phi_{ho} = -\pi/2$ (3) and the parametrical amplification leading to the depletion of the wave at the double frequency is achieved at the expense of the frequency doubling operation. Now, the desired goal is to introduce the lowest possible energy level into the laser (or laser diode), to lock the emission wavelength to the wavelength $\lambda o_a$.

In the case of a non-linear medium (NLM) in which the phase matching condition is met, several exemplary cases may be envisaged in the phase shifts $\phi_p$ and $\phi_h$ introduced by the mirror ($M_1$) should this mirror not be a perfect mirror capable of transmitting the harmonic wave entirely.

In the first example where $\phi_h=\phi_p=0$, the operation for the depletion of the pump continues in the RETURN direction and the condition $\phi$ is met in the to-and-fro directions.

In a second example, where the mirror ($M_1$) introduces phase shifts such that:

$$\phi_h \phi_p = \pm \pi$$

or $$\phi_p=0 \text{ and } \phi_h=\pm\pi$$

there occurs a re-amplification of the pump at the start of the interaction in the RETURN direction. This re-amplification of the pump results in a depletion of the harmonic wave sent back in the medium (NLM) in view of the very low power of this wave. During the propagation in the return direction, this depletion soon leads to the almost entire disappearance of the harmonic wave. From this point onwards, there is a reversal of the trend. Hence the frequency doubling starts again, and this again contributes to the anticipated pump depletion. It must be noted, and this is a fundamental point, that this reversal of a trend that occurs by itself and that forms a substantial advantage exists only when the phase matching technique used is of the artificial type (QAP). In this particular case, irrespectively of the phase shifts $\phi_p$ and $\phi_h$ introduced by the mirror ($M_1$), the depletion of the pump may take place in the so-called RETURN direction and thus permit the locking of the laser (or laser diode) to the desired wavelength.

This means especially that the mirror may be designed and formed for example by simple deposition of dielectric on the output face of a substrate bearing the guide within which the interaction takes place.

Exemplary application relating to a blue source with a wavelength of 415 nm

The blue source is obtained by the frequency doubling of the near infrared beam (wavelength of 860 nm) of a laser diode of the GaAs/GaAlAs type. This diode is supposed to show only one spatial mode to promote the coupling of the light energy in the frequency doubling component (NLM). This component may typically be a waveguide made on lithium tantalate by proton exchange. The reference (K. Yamamoto, K. Mizuuchi, Y. Kitaoka and M. Kato, "High power blue light generation by frequency doubling of a laser diode in a periodically domain-inverted LiTaO$_3$ waveguide", Applied Phys. Letter 62 (21), pp. 2599, 2601, 24 May 1993) describes a component of this type in which the quasi-phase matching (QAP) condition is provided by a grating obtained by the reversal of the non-linear coefficient brought into play by known techniques (notably by proton exchange and then fast annealing at a temperature in the region of 600° C.). The general principle of such a blue source is shown in FIG. 4. A laser diode (DL) emits a pump wave at $\lambda o_i$ that goes through a coupling optical system (OC) enabling the coupling of said pump wave within a waveguide (G) made in the component (NLM). The entry face ($F_1$) of the component (NLM) is subjected beforehand to dielectrical treatment at the wavelength of the pump wave. The exit face ($F_2$) of the component (NLM) for its part undergoes a preliminary dielectrical processing that makes it highly reflective for the pump wave and highly transparent for the harmonic wave so as to form the mirror ($M_1$). At the output of the component (NLM), it is thus possible to recover the blue source (Sb) with the wavelength $\lambda o_a/2$.

Given the constituent material (LiTaO$_3$) of the non-linear medium (NLM) and of the pump wavelength (860 nm), the period enabling the quasi-phase matching (QAP) condition to be met is 3.95 μm. The experimental efficiency of frequency doubling published in the above-mentioned reference by Yamamoto et al. corresponds to a standardized value of efficiency of over 230%/W.cm$^2$. This efficiency, which has no significance unless the depletion of the pump wave is negligible, is obtained by dividing the harmonic power measured at the output of the doubler by the square of the pump wave coupled in the doubler and by the square of the interaction distance. Starting from this conversion efficiency that is accessible in practice with a known technology, it is possible to assess the depletion of the pump wave during its reinjection into the diode as well as the power sought at the double frequency at output of the mirror ($M_1$).

On the basis of the following numerical data:

wavelength $\lambda o_a$ of QAP: 860 nm power of $P_{\omega,o}$ of pump used: 100 mw conversion efficiency (doubling): 230%/W.cm$^2$ for a mirror whose reflection coefficients are $R_{2\omega}=0.01$ for the harmonic wave $R\omega=0.9$ for the pump wave the following table is determined as a function of the interaction length L showing the depletion of the pump ($R\omega.P\omega$ corresponds to the power reinjected into the laser at the frequency $\omega$) as well as the power created at the frequency $2\omega$ at output of the mirror $M_1$.

| L (cm) | $R\omega.P\omega$ (mW) | $P_{2\omega}$ (mW) |
|---|---|---|
| 1 | 72,2 | 19,6 |
| 2 | 40,3 | 44,4 |
| 3 | 18,3 | 78,9 |

What is claimed is:

1. A compact optical source, comprising:

a laser emitting an incident wave having a wavelength in a range of $\lambda o_i$;

a non-linear medium comprising,
   a first end,
   a second end, and
   an internal molecular stucture such that upon excitation by said incident wave a harmonic wave of wavelength $\lambda o_i/2$ is generated and a phase matching condition exists that enables a cancellation of or compensation for a difference in propagation constant between a non-linear polarization created by said incident wave and said harmonic wave;

a dichroic mirror placed at said second end of said non-linear medium and being highly reflective of waves having a wavelength in said range of $\lambda o_i$ and highly transparent of waves having a wavelength of $\lambda o_i/2$;

said incident wave is directed at normal incidence to said first end of said non-linear medium such that wavelengths of $\lambda o_i/2$ pass through said dichroic mirror and out of said non-linear medium and any remaining wavelengths of said incident wave are reflected back into said laser, thereby creating a light source of wavelength $\lambda o_i/2$ and returning said incident wave depleted of wavelengths $\lambda o_i/2$ back to said laser.

2. A compact optical source according to claim 1, wherein said laser is a laser diode.

3. A compact optical source according to claim 1, wherein said non-linear medium has a birefringence that produces said phase matching condition.

4. A compact optical source according to claim 3, wherein said dichroic mirror introduces a phase shift $\phi h$ on said harmonic wave and a phase shift $\phi p$ on said reflected incident wave such that $2\phi_{po}-\phi_{ho}\neq \pm\pi$.

5. A compact optical source according to claim 1, wherein said phase matching condition is produced by a means for producing a periodic spatial modulation of a physical parameter of said non-linear medium that effects non-linear interaction between said incident wave and said harmonic wave.

6. A compact optical source according to claim 5, wherein said physical parameter is non-linear coefficient $d_{33}$.

7. A compact optical source according to one of claims 1, 3, or 5, wherein said non-linear medium is a waveguide.

8. A compact optical source according to one of claims 1, 3, or 5, wherein $\lambda o_i$ is near infrared (towards 860 nm) and said light source emitting in blue wavelengths (towards 430 nm).

9. A compact optical source according to claim 7, wherein $\lambda o_i$ is near infrared (towards 860 nm) and said light source emitting in blue wavelengths (towards 430 nm).

10. A compact optical source according to one of claims 1, 3, or 5, wherein said non-linear medium is lithium tantalate (LiTaO3).

11. A compact optical source according to claim 9, wherein said non-linear medium is lithium tantalate (LiTaO3).

12. A compact optical source according to one of claims 1, 3, or 5, wherein said non-linear medium is potassium and titanyl phosphate (KTP).

13. A compact optical source according to claim 9, wherein said non-linear medium is potassium and titanyl phosphate (KTP).

14. A compact optical source according to one of claims 1, 3, or 5, wherein said non-linear medium is lithium niobate (LiNbO3).

15. A compact optical source according to claim 9, wherein said non-linear medium is lithium niobate (LiNbO3).

16. A compact optical source according to one of claims 1, 3, or 5, wherein said dichroic mirror has a least one dielectric layer integrated into said non-linear medium.

17. A compact optical source according to claim 9, wherein said dichroic mirror has a least one dielectric layer integrated into said non-linear medium.

\* \* \* \* \*